United States Patent
Hill et al.

(10) Patent No.: US 6,986,089 B2
(45) Date of Patent: Jan. 10, 2006

(54) POWER REDUCTION IN SCANNABLE D-FLIP-FLOP WITH SYNCHRONOUS PRESET OR CLEAR

(75) Inventors: Anthony M. Hill, Dallas, TX (US); Richard D. Simpson, Bedford (GB)

(73) Assignee: Texas Instruments Incorporated, Dallas, TX (US)

( * ) Notice: Subject to any disclaimer, the term of this patent is extended or adjusted under 35 U.S.C. 154(b) by 542 days.

(21) Appl. No.: 10/256,723

(22) Filed: Sep. 27, 2002

(65) Prior Publication Data

US 2003/0110432 A1     Jun. 12, 2003

Related U.S. Application Data

(60) Provisional application No. 60/334,553, filed on Dec. 3, 2001.

(51) Int. Cl.
    *G01R 31/28*     (2006.01)
    *G06F 13/38*     (2006.01)

(52) U.S. Cl. ...................... 714/726; 711/109

(58) Field of Classification Search ............... 714/30, 714/724, 726, 727, 731; 327/141, 202, 199; 326/16, 46, 93; 377/78; 365/189.05, 185.18; 716/6; 711/103, 109
See application file for complete search history.

(56) References Cited

U.S. PATENT DOCUMENTS

| | | | |
|---|---|---|---|
| 5,323,400 A | * | 6/1994 | Agarwal et al. ............ 714/728 |
| 5,719,878 A | * | 2/1998 | Yu et al. .................... 714/726 |
| 6,763,489 B2 | * | 7/2004 | Nadeau-Dostie et al. ... 714/731 |

OTHER PUBLICATIONS

"Token Scan Cell for Low Power Testing" Huang et al. Electronics Letters Publication Date: May 24, 2001, pp. 678-679 vol.: 37, Issue: 11 ISSN: 0013-5194 Inspec Accession No.: 6952438.*

"A Token Scan Architecture for Low Power Testing" Huang et al. International Test Conference Proceedings, Publication Date Oct. 30-Nov. 1, 2001 pp. 660-669 Inspec Accession No.: 7211374.*

"An Analysis of Power Reduction Techniques in Scan Testing" by Saxena et al. International Test Conference Proceedings, 2001 Publication Date: Oct. 30-Nov. 1, 2001 pp. 670-677 Inspec Accession No.: 7211375.*

"Peak-Power Reduction for Multiple-Scan Circuits During Test Application" by Lee et al. Proceedings of the Ninth Asian Test Symposium, 2000. Publication Date: Dec. 4-6, 2000, pp. 453-458 Inspec Accession No.: 6846367.*

* cited by examiner

*Primary Examiner*—Guy Lamarre
*Assistant Examiner*—Cynthia Britt
(74) *Attorney, Agent, or Firm*—Robert D. Marshall, Jr.; W. James Brady, III; Frederick J. Telecky, Jr.

(57) ABSTRACT

In a scannable D master-slave flip-flop circuit with synchronous preset or clear capability, the output of the slave latch is gated with the scan-enable signal to form the scan-data-output signal. This output gating of the scan-output data that allows for considerable simplification of the input logic. This simplification also provides for the reduction in both the size and the number of transistors in the input logic. This in turn is multiplied many tens of thousands of times in a complex processor chip, resulting in a substantial reduction in chip power and silicon area usage.

8 Claims, 4 Drawing Sheets

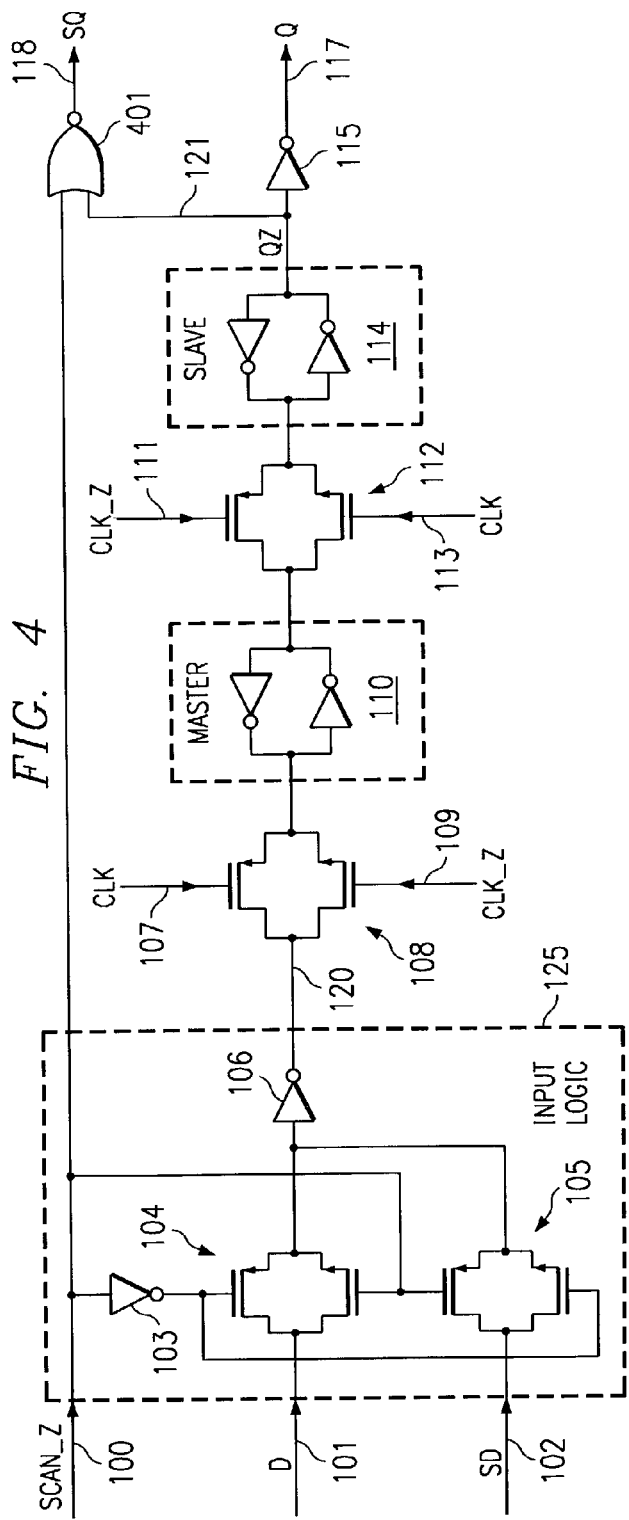
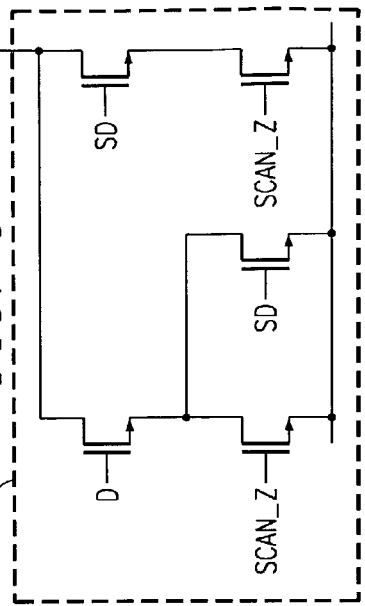
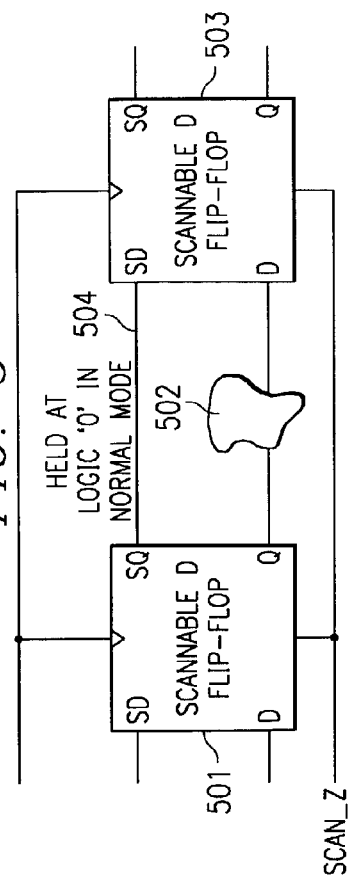

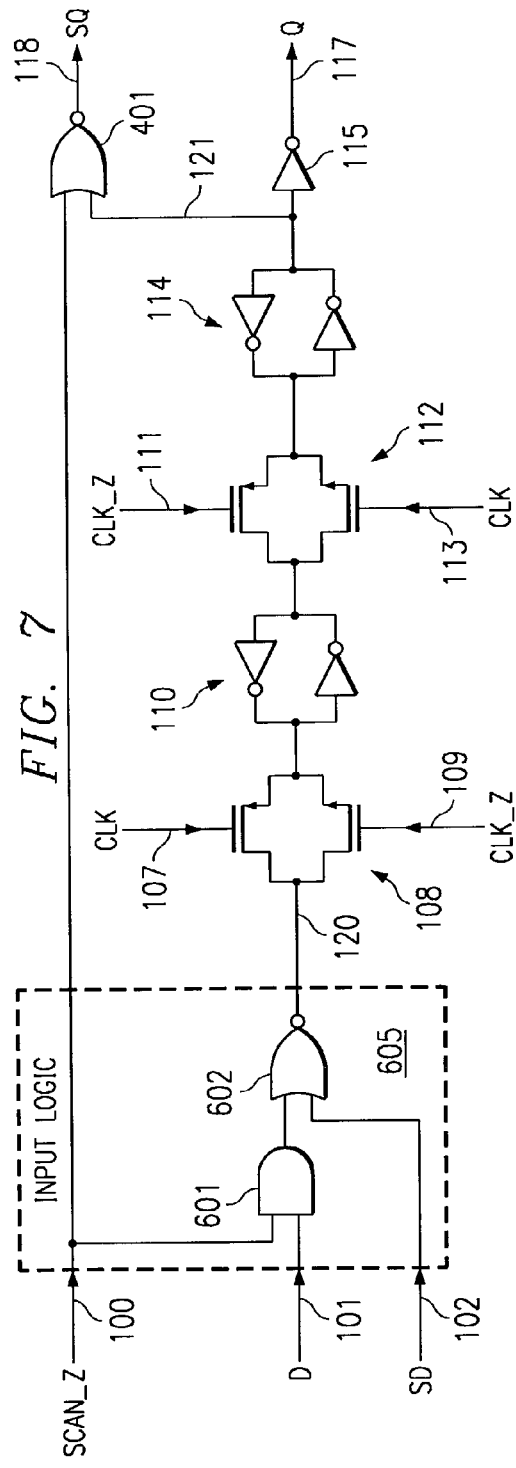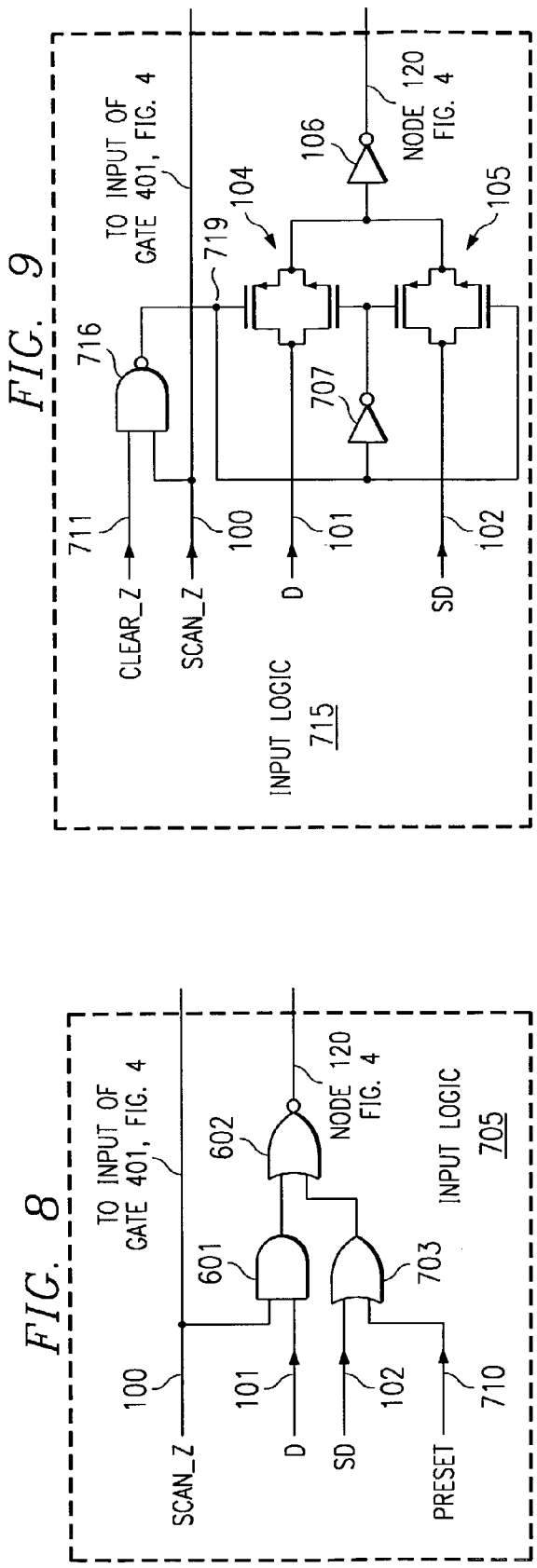

POWER REDUCTION IN SCANNABLE D-FLIP-FLOP WITH SYNCHRONOUS PRESET OR CLEAR

This application claims priority under 35 USC §119(e)(1) of Provisional Application No. 60/334,553, filed Dec. 3, 2001.

TECHNICAL FIELD OF THE INVENTION

The technical field of this invention is energy efficient electronic circuits and particularly energy efficient D flip-flop circuits used in control logic in microprocessors.

BACKGROUND OF THE INVENTION

D flip-flops are a highly used low-level function in microprocessor devices. In order to facilitate testing of microprocessor devices comprising many thousands of such flip-flops, these flip-flops include scan circuitry to provide a means for initializing logic in a desired state. With the scan hardware included in the flip-flop, it becomes possible with a minimum of additional test hardware, to fully determine the state of a microprocessor function by scanning in desired logic patterns from the external pins of the device. By this means testing may be carried out with a greatly reduced test pattern suite.

As more advanced higher speed architectures are developed, microprocessor logic will likely become more complex and concerns about power dissipation will increase. The challenge for the designer remains one of obtaining this higher speed performance while keeping the power dissipation at the lowest possible level. Techniques for power reduction in scannable flip-flops are of prime importance because these functions represent a large portion of the microprocessor device low-level functional blocks.

FIG. 1 illustrates a conventional scannable D flip-flop of prior art. The input logic 120 includes inverters 103 and 106, and transmission gates 104 and 105. This is a typical implementation for current designs. Transmission gate (TG) 104 is ON and transmission 105 is OFF when scan_z is 1 allowing the input data D 101 enter the master latch through gates 104, 106, and 108 when the clock signal CLK is 0. Transmission gate 105 is ON and transmission 104 is OFF when scan_z is 0. This couples input logic 125 to master latch 110 input by transmission gate 108. Master latch 110 and slave latch 114 are connected by transmission gate 112. Slave latch 114 is coupled to data output Q 117 by inverter 115 and is also coupled to the data output SQ 118 by inverter 116.

FIG. 2 illustrates the waveforms for this conventional scannable D flip-flop in the normal operating mode where scan_z is 1. The active positive edge of input clock (CLK) 107, 113 occurs at times 201 and 202. On these positive edges, data is transferred from data input D 101 to data output Q 117. Propagation delay between clock nodes 107, 113 to output Q 117 is denoted by time interval 203 for propagation of a logical 1 and by time interval 204 for propagation of a logical 0. Because the path to scan output SQ 118 is virtually the same as that to data output Q 117, scan output SQ 118 is shown to have an identical response as data output Q 117.

FIG. 3 illustrates the waveforms for the conventional scannable D flip-flop of FIG. 1 in scan mode where scan_z is 0. The active positive edge of input clock (CLK) 107, 113 occurs at times 301 and 302. On these positive edges, data is transferred from scan data input SD 102 to scan output SQ 118. Propagation delay between clock nodes 107 and 113 to scan output SQ 117 is denoted in FIG. 3 by time interval 303 for propagation of a logical 1 and by time interval 304 for propagation of a logical 0. Because the path to data output Q 117 is virtually the same as that to scan output SQ 118, the data output Q 117 is shown to have an identical response as data output SQ 118. Note that in the scan mode the data input 101 may be in an indeterminate state and it has no affect on the result.

SUMMARY OF THE INVENTION

This invention comprises a unique, energy-efficient fully scannable D flip-flop circuit with optional synchronous preset or clear capability. This circuit is comprised of a master latch and a slave latch, and input and output circuitry. Each of three embodiments of the master latch has an input circuit with up to five inputs: data-in; scan-data-in; scan-enable; an optional synchronous preset; and an optional synchronous clear. The master latch and slave latch are clocked on opposite phases of the clock. The slave latch receives its input from the output of the master latch. The data output Q is a buffered version of the slave latch output. The output of the slave latch is gated with the active-low scan-enable signal to form the scan-data-output signal.

It is the output gating of the scan-output data that allows for considerable simplification in the input logic and overall power reduction for the flip-flop element. The logic simplification allows for the reduction in both size and number of transistors in the input circuit. This simplification multiplied many tens of thousands of times in a complex processor chip results in a substantial reduction in chip power and silicon area usage.

BRIEF DESCRIPTION OF THE DRAWINGS

These and other aspects of this invention are illustrated in the drawings, in which:

FIG. 4 illustrates the schematic diagram of a D flip-flop circuit having no preset or clear inputs according to a first embodiment of this invention;

FIG. 5 illustrates the interconnection of two scannable D flip-flops;

FIG. 6 illustrates the input circuit which implements the logic for node 120 of FIG. 4;

FIG. 7 illustrates the schematic diagram of the D flip-flop circuit having no preset or clear inputs with input logic reduced, resulting from the analysis of equations 3 through 6;

FIG. 8 illustrates the input circuit of a second embodiment of this invention having a preset input but no clear input; and FIG. 9 illustrates the input circuit of a third embodiment of this invention having a clear input but no preset input.

DETAILED DESCRIPTION OF PREFERRED EMBODIMENTS

Figure 1:
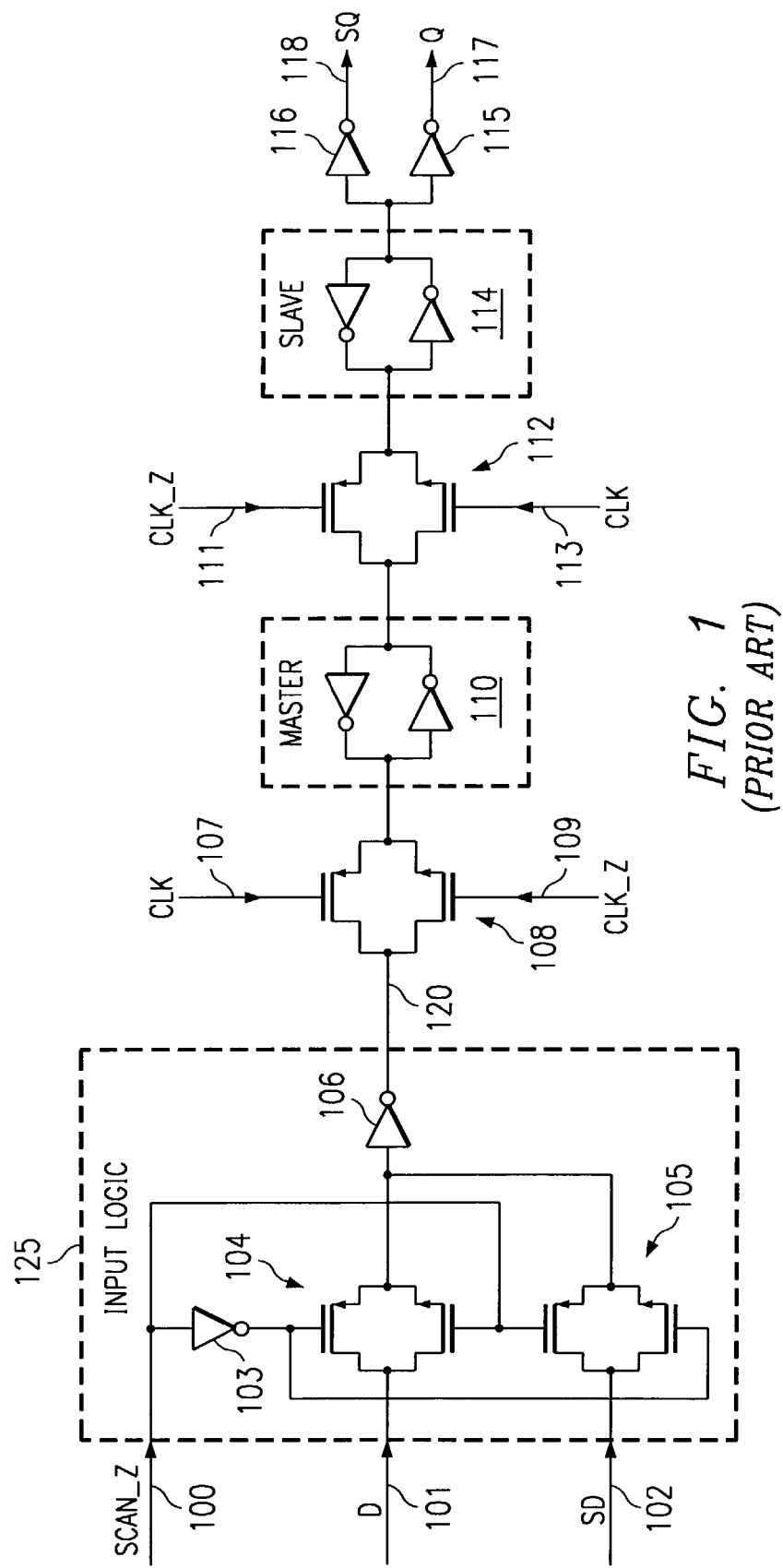
FIG. 1 illustrates in schematic diagram form a conventional D flip-flop circuit of the prior art.
Figure 2:
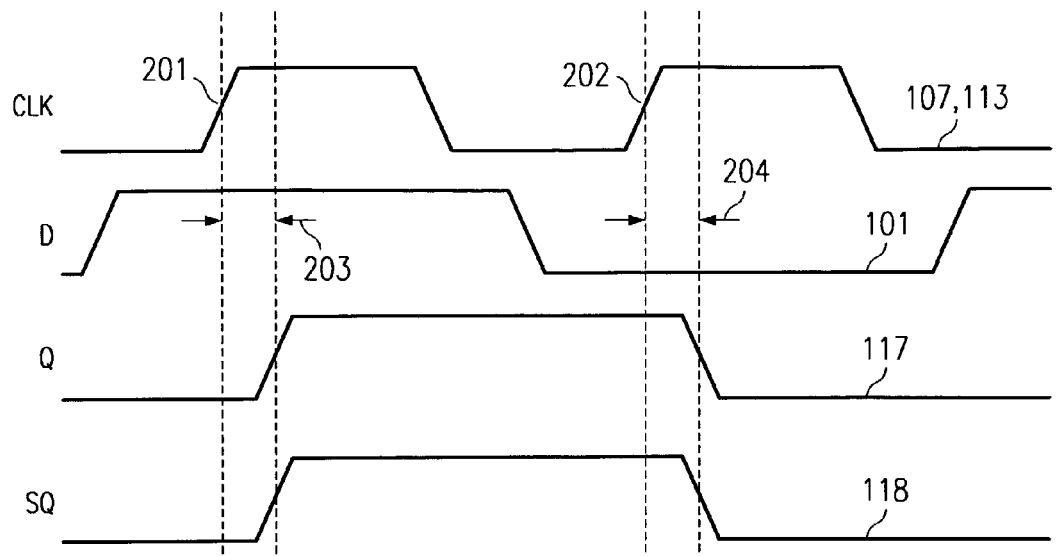
FIG. 2 illustrates the signal input and output waveforms in the normal operating mode for the conventional D flip-flop of FIG. 1.
Figure 3:
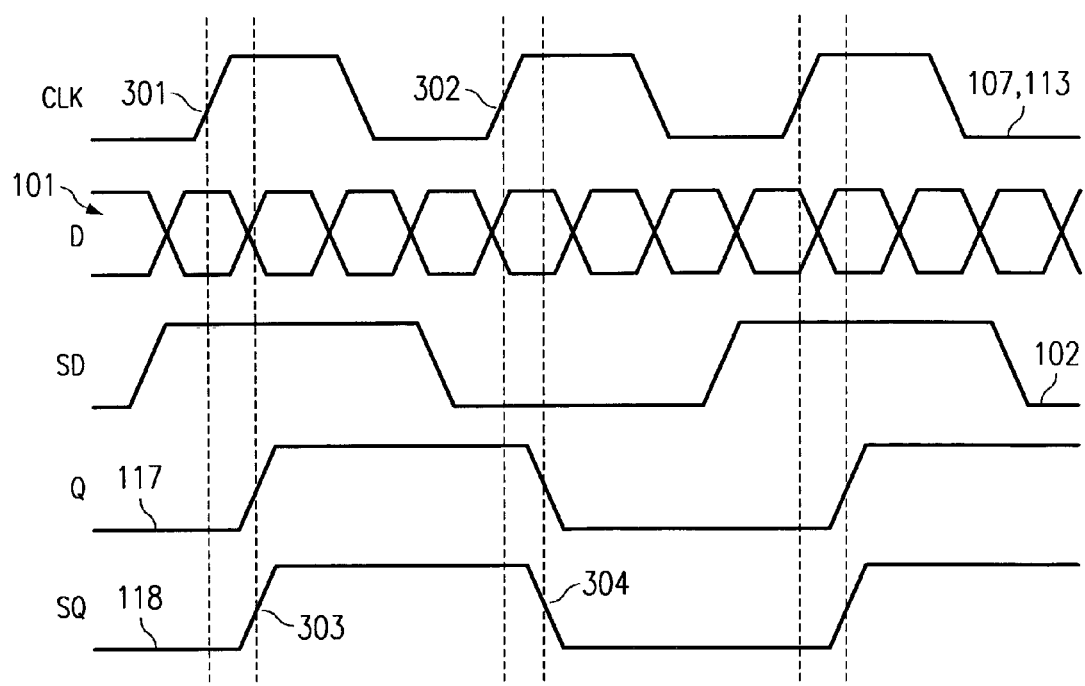
FIG. 3 illustrates the signal input and output waveforms in the scan mode for the conventional D flip-flop of FIG. 1.

FIG. 4 illustrates the schematic diagram of the preferred embodiment of the scannable D flip-flop circuit, of this invention. The input logic 125 illustrated in FIG. 4 is exactly the same as input logic 125 of the conventional flip-flop illustrated in FIG. 1. FIG. 4 differs from FIG. 1 in that scan output SQ 118 is derived from QZ 121, but is gated 0 by virtue of NOR gate 401 by the 1 state of scan_z 100. This is a very significant difference.

FIG. 5 illustrates the interconnection of two scannable D flip-flops which helps make clear the significance of this modification. First, FIG. 5 illustrates two D flip-flops 501 and 503 connected as part of a chain of scannable flip-flops. In the data path, typically, data from data output Q of flip-flop 501 passes through a logic path denoted by the logic cloud 502 to the data input D of flip-flop 503. In the scan data path 504, the scan output SQ of flip-flop 501 passes directly to scan data input SD of flip-flop 503.

Node 504 corresponds to node 118 in FIG. 4. Node 118 in the conventional flip-flop of FIG. 1 switches in step with data output Q 117. Node 504 in accordance with the circuit of FIG. 4 is held at 0 by the 1 state of the scan_z input in the normal operating mode. The input of scan_z to NOR gate 401 of FIG. 4 holds node 118 at 0 in the normal operating mode. This connection greatly reduces power dissipation in a system using many thousands of such flip-flops, by holding the output SQ at 0 rather than allowing it perform the same transitions as the output Q.

The second effect of the gating in NOR gate 401 of FIG. 4 is that using input scan_z to gate the scan data output to a logical 0 in scan mode permits simplifications of the input logic. These simplifications result in less silicon area usage because the number and/or size of the input gates is reduced. FIG. 7 illustrates the modified input circuit 605.

The signal relationships relating to this unmodified input circuit are presented in equations 1 and 2.

$$\text{scan\_z}=0 \Rightarrow \text{node\_120} = \overline{SD} \quad (1)$$

$$\text{scan\_z}=1 \Rightarrow \text{node\_120} = \overline{D} \quad (2)$$

Equation 1 expresses the concept that when scan_z is held at 0 in the scan mode, the output node_120 of this input stage logic may be expressed as the inverse of the scan data input SD. In equation 2, when the scan_z is held at 1 in the normal mode, the output node_120 of this input stage logic may be expressed as the inverse of the data input D. Equations 3, 4, 5, and 6 express successive simplifications of equations 1 and 2.

$$\text{node\_120} = \overline{\text{scan\_z}} \cdot \overline{SD} + \overline{\text{scan\_z} \cdot D} \quad (3)$$

$$\text{node\_120} = \overline{D \cdot SD} + \overline{\text{scan\_z} \cdot D} \quad (4)$$

$$\text{node\_120} = \overline{((D+SD) \cdot (\text{scan\_z}+SD))} \quad (5)$$

$$\text{node\_120} = \overline{(D \cdot \text{scan\_z} + D \cdot SD) + (SD \cdot \text{scan\_z})} \quad (6)$$

Equation 4 follows from equation 4 because when scan_z is 1, NOR gate from the prior scannable flip-flop forces the scan output SD to 0.

Table 1 shows the truth table for node_120.

TABLE 1

| D | SD | scan_z | node_120 |
|---|----|--------|----------|
| 0 | 0  | 0      | 1        |
| 0 | 0  | 1      | 1        |
| 0 | 1  | 0      | 0        |
| 0 | 1  | 1      | 1        |
| 1 | 1  | 1      | 0        |

TABLE 1-continued

| D | SD | scan_z | node_120 |
|---|----|--------|----------|
| 1 | 1  | 0      | 0        |
| 1 | 0  | 0      | 1        |
| 1 | 0  | 1      | 0        |

FIG. 6 illustrates the simplified gating function 518. This is an efficient implementation of the reduced input logic of equation 6. This type of implementation reduces both power dissipation and silicon area. Area reduction results because the layout is less complex and more compact. The layout also uses smaller transistor sizes for a given circuit performance. Power reduction results because fewer nodes undergo switching transitions during operation in either scan or non-scan mode. Note that input circuit 518 of FIG. 6 requires only 5 transistors. Input circuit 125 requires a minimum of 8 transistors, 2 transistors for each of inverters 103 and 106 and 2 transistors for each of transmission gates 104 and 105.

FIG. 7 illustrates the schematic diagram of a D flip-flop circuit having no preset or clear inputs, with input logic 605 reduced resulting from the analysis of FIG. 6 and equations 3 through 6. AND gate 601 receives scan_z and the date input D as inputs. The output of AND gate 601 supplies one input of NOR gate 602. The second input of NOR gate 602 is the scan data input SD. Note that when scan_z is 1, the output of AND gate 601 is the data input D. Since NOR gate 401 of the prior scannable flip-flop forces scan data input SD to 0 when scan_z is 1, NOR gate 602 inverts the data input D. Thus the output is in accordance with equation 2. When scan_z is 0, the output of AND gate 601 is always at 0. Thus NOR gate inverts the scan data input SD in accordance with equation 1.

FIGS. 7, 8 and 9 illustrate three possible input circuits relating to three alternative embodiments of the invention. In FIG. 7, the gates 601 and 602 which form the input logic 605 replace the input circuit 125 of FIGS. 1 and 4. This yields a simplified layout using smaller transistors compared to those required to implement input circuit 125.

FIG. 8 illustrates input circuit 705 of a second embodiment of the invention modified to add the synchronous preset. OR Gate 703 receives scan data SD 102 at one input and PRESET signal 710 at a second input. The output of OR flip-flop with the input circuit 705 illustrated in FIG. 8 can be preset only during normal mode. During normal mode scan data input SD 102 is always at 0, thus OR gate 703 passes PRESET signal 710 to the second input of NOR gate 602. When PRESET signal 710 is 1, indicating a preset operation, the output at node 120 is always 0. This presets master latch 110.

FIG. 9 illustrates modified input circuit 715. The original input circuit 125 of FIG. 1 and FIG. 4 is modified to add the synchronous clear. The synchronous clear signal 711 supplies one input of NAND gate 716. The other input of NAND gate 716 comes from scan_z signal 100. The output of NAND gate 716 supplies the gates of transmission gates 104 and 105 either directly or via inverter 707. The connections of inverter 707 to transmission gates 104 and 105 are opposite the connections of inverter 103 of FIGS. 1 and 4. This accounts for the inversion of the scan_z signal 100 by NAND gate 716.

All three embodiments of the invention include feeding forward the scan_z signal 100 to the gating provided by NOR gate 401 of FIG. 4. This is the crucial point in the power reduction provided by the invention. The scan data outputs SQ of flip-flops throughout the chip are held in a 0 state in normal mode.

What is claimed is:

1. A scannable flip-flop comprising:
   an input circuit including
      an AND gate having a first input receiving a scan enable signal, a second input receiving a data input signal and an output, and
      a NOR gate having a first input connected to said output of said AND gate, a second input receiving a scan data signal from a prior scannable flip-flop in a serial chain and an output forming an output of said input circuit;
   a latch circuit having an input connected to said output of said input circuit and an output, said latch circuit storing a state at said input and supplying said state to said output; and
   an output circuit including
      an inverter having an input connected to said output of said latch circuit and an output supplying a data output, and
      a NOR gate having a first input receiving said scan enable signal, a second input connected to said output of said latch circuit and an output supplying a scan data output connected to said scan data input of a next flip-flop in said serial chain.

2. The scannable flip-flop of claim 1, wherein:
   said latch circuit includes
      a first transmission gate receiving a clock signal in a first phase having an input connected to said output of said input circuit and an output,
      a master latch having an input connected to said output of said first transmission gate and an output,
      a second transmission gate receiving said clock signal in a second phase opposite to said first phase having an input connected to said input of said master latch and an output, and
      a slave latch having an input connected to said output of said second transmission gate and an output connected to said output circuit.

3. A scannable flip-flop comprising:
   an input circuit including
      a first transistor having a source-drain path connected between an output and a first node and a gate receiving a data input,
      a second transistor having a source-drain path connected between said first node and a reference voltage and a gate receiving a scan enable signal,
      a third transistor having a sourcedrain path connected between said first node and said reference voltage and a gate receiving scan data from a prior scannable flip-flop in a serial chain,
      a fourth transistor having a source-drain path connected between said output and a second node and a gate receiving scan data from a prior scannable flip-flop in a serial chain, and
      a fifth transistor having source-drain path connected between said second node and said reference voltage and a gate receiving said scan enable signal;
   a latch circuit having an input connected to said output of said input circuit and an output, said latch circuit storing a state at said input and supplying said state to said output; and
   an output circuit including
      an inverter having an input connected to said output of said latch circuit and an output supplying a data output, and
      a NOR gate having a first input receiving said scan enable signal, a second input connected to said output of said latch circuit and an output supplying a scan data output connected to said scan data input of a next flip-flop in said serial chain.

4. The scannable flip-flop of claim 3, wherein:
   said latch circuit includes
      a first transmission gate receiving a clock signal in a first phase having an input connected to said output of said input circuit and an output,
      a master latch having an input connected to said output of said first transmission gate and an output,
      a second transmission gate receiving said clock signal in a second phase opposite to said first phase having an input connected to said input of said master latch and an output, and
      a slave latch having an input connected to said output of said second transmission gate and an output connected to said output circuit.

5. A scannable flip-flop comprising:
   an input circuit including
      an AND gate having a first input receiving a scan enable signal, a second input receiving a data input signal and an output,
      an OR gate having a first input receiving scan data from a prior scannable flip-flop in a serial chain, a second input receiving a preset signal and an output, and
      a NOR gate having a first input connected to said output of said AND gate, a second input connected to said output of said OR gate and an output forming an output of said input circuit;
   a latch circuit having an input connected to said output of said input circuit and an output, said latch circuit storing a state at said input and supplying said state to said output; and
   an output circuit including
      an inverter having an input connected to said output of said latch circuit and an output supplying a data output, and
      a NOR gate having a first input receiving said scan enable signal, a second input connected to said output of said latch circuit and an output supplying a scan data output connected to said scan data input of a next flip-flop in said serial chain.

6. The scannable flip-flop of claim 5, wherein:
   said latch circuit includes
      a first transmission gate receiving a clock signal in a first phase having an input connected to said output of said input circuit and an output,
      a master latch having an input connected to said output of said first transmission gate and an output,
      a second transmission gate receiving said clock signal in a second phase opposite to said first phase having an input connected to said input of said master latch and an output, and
      a slave latch having an input connected to said output of said second transmission gate and an output connected to said output circuit.

7. A scannable flip-flop comprising:
   an input circuit including
      a NAND gate having a first input receiving a clear signal, a second input receiving a scan enable signal and an output, a first inverter having an input connected to said output of said NAND gate and an output, a first transmission gate having an input receiving a data signal, an output and having gates connected to said output of said NAND gate and said output of said first inverter in a first phase, a second transmission gate having an input receiving a scan data signal from a prior scannable flipflop in a serial chain, an output and having gates connected to said output of said NAND gate and said output of said first inverter in a second phase opposite to said first phase, and a second inverter having an input connected to the output of said first transmission gate and the output of said second transmission and an output forming an output of said input circuit;

a latch circuit having an input connected to said output of said input circuit and an output, said latch circuit storing a state at said input and supplying said state to said output; and an output circuit including an inverter having an input connected to said output of said latch circuit and an output supplying a data output, and a NOR gate having a first input receiving said scan enable signal, a second input connected to said output of said latch circuit and an output supplying a scan data output connected to said scan data input of a next flip-flop in said serial chain.

8. The scannable flip-flop of claim 7, wherein:

said latch circuit includes a first transmission gate receiving a clock signal in a first phase having an input connected to said output of said input circuit and an output, a master latch having an input connected to said output of said first transmission gate and an output, a second transmission gate receiving said clock signal in a second phase opposite to said first phase having an input connected to said input of said master latch and an output, and a slave latch having an input connected to said output of said second transmission gate and an output connected to said output circuit.

* * * * *